(12) United States Patent
van Neer et al.

(10) Patent No.: US 9,656,440 B2
(45) Date of Patent: May 23, 2017

(54) RELEASABLE SUBSTRATE ON A CARRIER

(71) Applicant: NEDERLANDSE ORGANISATIE VOOR TOEGEPAST-NATUURWETEN SCHAPPELIJK ONDERZOEK TNO, 's-Gravenhage (NL)

(72) Inventors: Martin K. P. van Neer, 's-Gravenhage (NL); Karin Tempelaars, 's-Gravenhage (NL); Linda B. van Leuken, 's-Gravenhage (NL)

(73) Assignee: NEDERLANDSE ORGANISATIE VOOR TOEGEPAST-NATUURWETEN SCHAPPELIJK ONDERZOEK TNO, 'S-Gravenhage (NL)

(*) Notice: Subject to any disclaimer, the term of this patent is extended or adjusted under 35 U.S.C. 154(b) by 0 days.

(21) Appl. No.: 14/433,454

(22) PCT Filed: Oct. 4, 2013

(86) PCT No.: PCT/NL2013/050709
§ 371 (c)(1),
(2) Date: Apr. 3, 2015

(87) PCT Pub. No.: WO2014/054949
PCT Pub. Date: Apr. 10, 2014

(65) Prior Publication Data
US 2015/0231858 A1 Aug. 20, 2015

(30) Foreign Application Priority Data
Oct. 4, 2012 (EP) .................................. 12187241

(51) Int. Cl.
*B32B 3/02* (2006.01)
*B32B 7/12* (2006.01)
(Continued)

(52) U.S. Cl.
CPC .................. *B32B 7/12* (2013.01); *B32B 7/14* (2013.01); *B32B 37/0046* (2013.01);
(Continued)

(58) Field of Classification Search
CPC ....... B32B 7/12; B32B 39/00; B32B 37/0046; B32B 2037/1253; B32B 2037/546;
(Continued)

(56) References Cited

U.S. PATENT DOCUMENTS

| | | |
|---|---|---|
| 6,391,679 B1 | 5/2002 | Anker et al. |
| 8,012,288 B2 | 9/2011 | Kim et al. |

(Continued)

FOREIGN PATENT DOCUMENTS

| | | |
|---|---|---|
| EP | 1 464 688 A1 | 10/2004 |
| WO | 2005050754 A1 | 6/2005 |

(Continued)

OTHER PUBLICATIONS

International Search Report and Written Opinion dated Dec. 3, 2013 for PCT/NL2013/050709.
(Continued)

*Primary Examiner* — Elizabeth Mulvaney
(74) *Attorney, Agent, or Firm* — Knobbe, Martens, Olson & Bear, LLP

(57) ABSTRACT

A method and system provide a releasable substrate on a carrier. The method includes providing the carrier with a bonding layer of radiation curable adhesive; selectively irradiating a first area subsection of the bonding layer with a first radiation for selectively at least partially curing the first area subsection; bringing a substrate in contact with the first area subsection and a second area subsection of the bonding layer; and curing the second area subsection in contact with the substrate for forming an adhesion area between the second area subsection and the substrate. The
(Continued)

first area subsection forms a release area with an adhesion force between the bonding layer and the substrate lower in the release area than in the adhesion area as a result of the first area subsection being more cured than the second area subsection prior to being in contact with the substrate.

16 Claims, 9 Drawing Sheets

(51) Int. Cl.
*B32B 37/00* (2006.01)
*B32B 39/00* (2006.01)
*B32B 37/12* (2006.01)
*B32B 38/00* (2006.01)
*B32B 7/14* (2006.01)

(52) U.S. Cl.
CPC .......... *B32B 37/12* (2013.01); *B32B 38/0008* (2013.01); *B32B 39/00* (2013.01); *B32B 2037/1253* (2013.01); *B32B 2307/546* (2013.01); *B32B 2310/0831* (2013.01); *B32B 2311/00* (2013.01); *B32B 2457/00* (2013.01); *B32B 2457/20* (2013.01); *Y10T 156/1052* (2015.01); *Y10T 428/24851* (2015.01)

(58) Field of Classification Search
CPC ............. B32B 2311/00; B32B 2457/20; Y10T 428/24802; Y10T 428/24851
See application file for complete search history.

(56) References Cited

U.S. PATENT DOCUMENTS

| | | |
|---|---|---|
| 2006/0207967 A1 | 9/2006 | Bocko et al. |
| 2008/0099134 A1 | 5/2008 | Tadakuma |
| 2009/0230280 A1 | 9/2009 | Shinn et al. |
| 2010/0264112 A1 | 10/2010 | Jiang et al. |
| 2011/0104973 A1 | 5/2011 | Wang et al. |
| 2012/0003470 A1 | 1/2012 | Kamiya |
| 2012/0201961 A1 | 8/2012 | Liao et al. |
| 2014/0111837 A1* | 4/2014 | Menz ...................... B32B 27/36 359/2 |

FOREIGN PATENT DOCUMENTS

| | | |
|---|---|---|
| WO | 2008005979 A1 | 1/2008 |
| WO | 2010146524 A1 | 12/2010 |
| WO | 2011/151457 A1 | 12/2011 |

OTHER PUBLICATIONS

Janglin Chen and Jia-Chong Ho, "A Flexible Universal Plane for Displays", http://informationdisplay.org/IDArchive/2011/February/ Frontline Technology.

* cited by examiner

RELEASABLE SUBSTRATE ON A CARRIER

CROSS REFERENCE TO RELATED APPLICATIONS

This application is the U.S. National Phase of International Application No. PCT/NL2013/050709, filed Oct. 4, 2013, designating the U.S. and published in English as WO 2014/054949 on Apr. 10, 2014 which claims the benefit of European Patent Application No. 12187241.0, filed Oct. 4, 2012.

FIELD AND BACKGROUND OF THE INVENTION

The present invention relates to a releasable substrate on a carrier and a method and system for providing such.
Flexible displays represent an upcoming trend in next-generation display technology. A flexible display may comprise a flexible substrate with electronics such as thin film transistors (TFT) or other components manufactured thereon. Manufacturing of electronics, in particular integrated circuitry, may comprise harsh processing conditions, e.g. exposure to radiation and/or vacuum in a lithographic step, and/or exposure to high temperatures, e.g. during baking steps. A problem encountered during manufacturing of electronics directly on a flexible substrate may be a low dimensional and/or thermal stability of the substrate. This may result e.g. in alignment issues during lithographic exposure. One solution for improving the stability of a substrate may be adhering the substrate to a carrier during manufacturing.

On the one hand adhesion between the substrate and carrier should be strong enough to withstand the various processing conditions encountered during manufacturing, e.g. high temperature, vacuum, UV radiation, and rapid acceleration. On the other hand the adhesion should not prevent release of the substrate from the carrier after manufacturing without damaging the electronics. It can be challenge to find a compromise between these two criteria.

As a first solution, WO2011/151457 discloses a technique comprising: securing a device substrate to a carrier using one or more adhesive elements; forming electronic elements on the device substrate with the device substrate thus secured to the carrier; and thereafter reducing the adhesion strength of at least one of the one or more adhesive elements to facilitate the release of the substrate from the carrier. The reduction in adhesion strength is triggered by a threshold temperature. Unfortunately, such adhesive elements may not be suitable for withstanding high temperatures (>200° C.) or other harsh processing conditions encountered during manufacturing.

As another solution, US 2012/0201961 discloses a method for fabricating a substrate structure applied in flexible electrical devices comprising providing a carrier, forming a release layer on the carrier with a first area and forming a flexible substrate on the release layer and the carrier with a second area, wherein the second area is larger than the first area and the flexible substrate has a greater adhesion force than that of the release layer to the carrier. The release layer with greater adhesion force can be separated from the carrier by cutting along the two ends of the release layer with lower adhesion force. Unfortunately, this method relies on the foil being solution processed and able to adhere to the carrier. Also, this method may be unsuitable for large substrates.

There is a need for a releasable substrate on a carrier that is able to withstand harsh processing conditions encountered during manufacturing yet can be easily removed after processing. There is a further need for being able to process a wider variety of substrates. Correspondingly there is a need for method of providing said releasable substrate on a carrier and a system for implementing said method.

SUMMARY OF THE INVENTION

In a first aspect there is provided a method for providing a releasable substrate on a carrier. The method comprises providing the carrier with a bonding layer of radiation curable adhesive. The method further comprises selectively irradiating a first area subsection of the bonding layer with a first radiation dose per unit area for selectively at least partially curing the first area subsection, wherein a second area subsection of the bonding layer is not irradiated or irradiated with a second radiation dose per unit area that is less than the first radiation dose per unit area such that the first area subsection is more cured than the second the area subsection. The method further comprises providing a substrate and bringing the substrate in contact with the first area subsection and the second area subsection; curing the second area subsection in contact with the substrate for forming an adhesion area between the second area subsection and the substrate. The first area subsection forms a release area, wherein an adhesion force between the bonding layer and the substrate is lower in the release area than in the adhesion area as a result of the first area subsection being more cured than the second area subsection prior to being in contact with the substrate.

During manufacturing, the substrate is adhered to the carrier by a relatively strong adhesion force exerted at the adhesion area. After manufacturing, the substrate can be cut along a perimeter inside the release area free of the adhesion area. The cut part of the substrate thus forms a releasable substrate that can be released due to a relatively weak adhesion force exerted at the release area. Accordingly, a method is provided for providing a releasable substrate on a carrier that is able to withstand harsh processing conditions encountered during manufacturing yet can be easily removed after processing.

A bonding layer with a radiation curable adhesive is provided wherein an adhesion force can be selectively controlled for different area subsections of the layer by selectively irradiating the radiation curable adhesive before contacting the substrate onto the bonding layer. After the substrate contacts the bonding layer, and the bonding layer is further cured, those areas that were not cured before by the radiation will cure in contact with the substrate thus forming a relatively strong connection to the substrate. Conversely, those areas that were at least partially cured before the contact with the substrate will form a weaker or no connection therewith. The bonding layer with tunable adhesion force does not require the foil to be solution processed or able to adhere directly to the carrier. Furthermore, the tunability of the adhesion forces of the adhesion area as well as the release area, may allow larger substrates to be processed without being damaged during processing or release. For example by partially curing the release area before contacting a substrate, this release area may still exhibit a mild adhesion force sufficient to prevent delaminating of the substrate in this area during e.g. vacuum processing conditions. Accordingly, a method is provided with which a wide variety of substrates, e.g. prefabricated foils and large substrates, can be processed.

In a second aspect there is provided a system for providing a releasable substrate on a carrier. The system comprises a supply system, a radiation system, a substrate application system, a curing system, and a controller. The controller is arranged for controlling the supply system for providing the carrier with a bonding layer of radiation curable adhesive. The controller is further arranged for controlling the radiation system for selectively irradiating a first area subsection of the bonding layer with a first radiation dose per unit area for selectively at least partially curing the first area subsection, wherein a second area subsection of the bonding layer is not irradiated or irradiated with a second radiation dose per unit area that is less than the first radiation dose per unit area such that the first area subsection is more cured than the second the area subsection. The controller is further arranged for controlling the substrate application system for providing a substrate and bringing the substrate in contact with the first area subsection and the second area subsection. The controller is further arranged for controlling the curing system for curing the second area subsection in contact with the substrate for forming an adhesion area between the second area subsection and the substrate. The first area subsection forms a release area, wherein an adhesion force between the bonding layer and the substrate is lower in the release area than in the adhesion area as a result of the first area subsection being more cured than the second area subsection prior to being in contact with the substrate.

The system according to the second aspect may have similar advantages as the method according to the first aspect.

In a third aspect there is provided a releasable substrate on a carrier comprising a substrate, a carrier and a bonding layer. The substrate is suitable for manufacturing electronics thereon. The carrier is arranged for carrying the substrate. The bonding layer is formed by a cured adhesive between the substrate and the carrier. The cured adhesive is obtainable from curing a radiation curable adhesive. The bonding layer is divided into a first area subsection and a second area subsection. A release area is formed between the first area subsection and the substrate and an adhesion area is formed between the second area subsection and the substrate. An adhesion force between the substrate and the bonding layer is lower at the release area than at the adhesion area. The lower adhesion force is obtainable by the radiation curable adhesive being more cured at the first area subsection than at the second area subsection prior to the substrate contacting the bonding layer.

The releasable substrate on a carrier according to the third aspect may be obtainable with a method according to the first aspect or a system according to the second aspect. Accordingly, said releasable substrate on a carrier may have similar advantages.

BRIEF DESCRIPTION OF THE DRAWINGS

These and other features, aspects, and advantages of the apparatus, systems and methods of the present invention will become better understood from the following description, appended claims, and accompanying drawing wherein:

DETAILED DESCRIPTION

Figure 1:
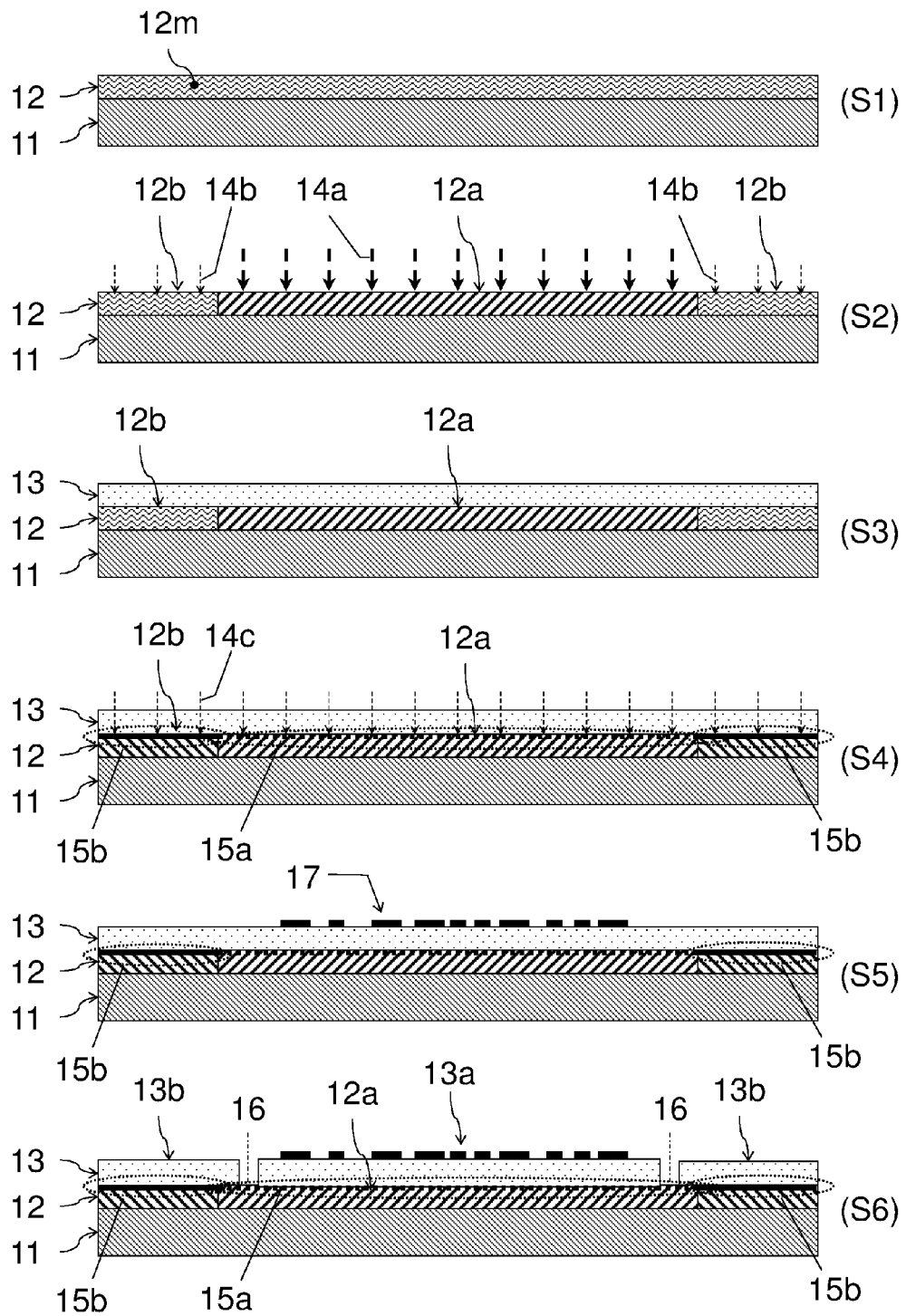
FIG. 1 shows an embodiment of a method for providing a releasable substrate on a carrier.

Unless otherwise defined, all terms used herein have the same meaning as commonly understood by one of ordinary skill in the art to which this invention belongs as read in the context of the description and drawings. It will be further understood that terms, such as those defined in commonly used dictionaries, should be interpreted as having a meaning that is consistent with their meaning in the context of the relevant art and will not be interpreted in an idealized or overly formal sense unless expressly so defined herein. In some instances, detailed descriptions of well-known devices and methods may be omitted so as not to obscure the description of the present systems and methods. Terminology used for describing particular embodiments is not intended to be limiting of the invention. As used herein, the singular forms "a", "an" and "the" are intended to include the plural forms as well, unless the context clearly indicates otherwise. The term "and/or" includes any and all combinations of one or more of the associated listed items. It will be further understood that the terms "comprises" and/or "comprising" specify the presence of stated features but do not preclude the presence or addition of one or more other features. All publications, patent applications, patents, and other references mentioned herein are incorporated by reference in their entirety. In case of conflict, the present specification, including definitions, will control.

As used herein, the term "substrate" has it usual meaning in materials science as an object comprising a surface on which processing is conducted. The substrate is preferably suitable for manufacturing electronics thereon, e.g. integrated circuitry. Processing may comprise fabrication of electronic structures on a substrate in one or more processing steps, e.g. layer deposition, exposure, curing, etcetera. In a typical semi-conductor manufacturing process, the substrate may be a silicon wafer. In the production of flexible electronics, the substrate typically comprises a foil. The term "foil" refers to a sheet comprising one or more layers of material. Preferably, the foil is flexible such that it can be used in a roll-to-roll (R2R) or roll to sheet (R2S) manufacturing process. For such purpose, a foil may be considered flexible if it can be rolled or bent over a radius of curvature of 50 cm or less, e.g. 12 cm, without losing its essential functionality, e.g. an electronic functionality. Alternatively, or in conjunction a foil may be considered flexible if it has a flexural rigidity smaller than 500 Pa·m^3.

As used herein, a carrier comprises a structure capable of carrying a substrate. For the purposes of the present disclosure, the adhering of the substrate to the carrier preferably improves the dimensional and/or thermal stability of the substrate. For example, a flexural rigidity of the combined carrier and substrate may be higher than that of the substrate alone. As a further example, a heat expansion coefficient along a surface of the substrate may be smaller when it is adhered to the carrier. As a further example, the substrate and or electronics deposited thereon may be less prone to breakage when it is adhered to the carrier.

As used herein, a bonding layer is layer capable of bonding adjacent surfaces together, e.g. the surfaces of a carrier and substrate. A bonding layer typically comprises an adhesive that is capable of adhering to adjacent surfaces. Adhesive bonding may thus refer to a bonding technique wherein an intermediate layer (the bonding layer) is used to connect the carrier and the substrate. Typical process steps for applying an adhesive bonding layer may comprise cleaning and pre-treatment of the surfaces, application of the bonding layer, contacting the surfaces with the bonding layer there between, and curing the adhesive in the bonding layer. The bonding layer may be applied to one or both surface e.g. by spin-coating, roll lamination, inkjet printing, spray-on, screen-printing, embossing, dispensing or block printing. In one embodiment, the bonding layer may be applied as an adhesive compound in a solution, wherein the solution is evaporated after application.

Adhesives typically comprise a material that forms adhesive bonds with a surface contacting the material while it cures. The curing of an adhesive may comprise a hardening of the adhesive, e.g. from a liquid state into a solid state. The curing may also comprise an increase in viscosity of the adhesive. Typically, if an adhesive is fully or partially cured before being brought into contact with a surface, the adhesive may be less prone to form adhesive bonds with said surface. This may e.g. be a result of a reduced wetting of the adhesive on the surface.

A curing rate of an adhesive may depend on e.g. humidity, temperature, radiation, and/or applied pressure. In the present disclosure, preferably a radiation curable adhesive is used, i.e. an adhesive whose curing rate can be influenced by radiation such as electromagnetic radiation (e.g. ultraviolet light) or ion radiation (e.g. proton beam). The curing rate of the radiation curable adhesive may additionally also be influenced by other factors such as temperature. The state of curing of an adhesive layer may be a cumulative process, e.g. a radiation dose may partially cure an adhesive layer at an accelerated rate while the layer continues to cure at a lower rate after the radiation is halted. The curing may also be accelerated e.g. when subjecting the adhesive to elevated temperatures.

In one embodiment, the adhesive comprises a compound that cures by polymerization. The polymerization may e.g. comprise a cationically-induced polymerization reaction. The adhesive may further comprise an initiator that catalyzes the polymerization reaction under the influence of radiation, e.g. a photo-acid that release cations, e.g. protons, under the influence of photonic energy. An advantage of a radiation curable adhesive, especially a photo curable adhesive, is that the curing rate can be locally controlled by controlling a radiation dose on the adhesive. By pre-curing the adhesive layer before contact with a surface an adhesive strength potential may be controlled. A degree of curing may be determined e.g. by a viscosity and/or glass transition temperature of the adhesive. The viscosity and/or glass transition temperature may e.g. be a function of the percentage of cross-links formed in the adhesive, e.g. by polymerization. The viscosity may also be a function of a temperature of the adhesive.

In one embodiment, by curing the adhesive, a glass transition temperature of the adhesive is elevated, e.g. by an induced formation of cross-links in the adhesive. For example, a glass transition temperature of SU-8 may range between about 50° C. for an unexposed film to about 230° C. after cross-linking. To maintain a solid connection during manufacturing, a glass transition temperature of the adhesive is preferably set higher than a highest temperature encountered during said manufacturing. E.g. suppose that in a series of manufacturing processes, the maximum temperature of the substrate/adhesive is 220° C. It may in this case be advantageous to cure the adhesive by radiation and/or temperature such that a glass transition temperature of the adhesive is elevated higher than 220° C., e.g. 230° C.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. The description of the exemplary embodiments is intended to be read in connection with the accompanying drawings, which are to be considered part of the entire written description. In the drawings, the size and relative sizes of systems, components, layers, and regions may be exaggerated for clarity. Embodiments are described with reference to cross-section illustrations that are schematic illustrations of possibly idealized embodiments and intermediate structures of the invention.

In the description, relative terms as well as derivatives thereof should be construed to refer to the orientation as then described or as shown in the drawing under discussion. These relative terms are for convenience of description and do not require that the system be constructed or operated in a particular orientation unless stated otherwise. It will further be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to", "directly coupled to", or "in contact with" another element or layer, there are no intervening elements or layers present. It will further be understood that when a particular step of a method is referred to as subsequent to another step, it can directly follow said other step or one or more intermediate steps may be carried out before carrying out the particular step. Like numbers refer to like elements throughout.

FIG. 1 shows steps of a method for providing a releasable substrate 13a on a carrier 11. The carrier 11 and other layers are shown in a cross-sectional side view.

In step (S1) of the method, the carrier 11 is provided with a bonding layer 12 of radiation curable adhesive 12m. In an embodiment, the carrier 11 comprises a rigid structure, e.g. constructed from a silicon or glass wafer or comprising metal. This has an advantage that a substrate 13 adhered to the carrier 11 may also behave as a rigid structure. Alternatively, in another embodiment, the carrier 11 can be flexible, e.g. a flexible foil. This has an advantage that the combined carrier and substrate may be flexible to be used e.g. in a roll-to-roll process. The flexible foil may also comprise a metal foil, e.g. comprising stainless steel.

Preferably, the bonding layer 12 is provided as a continuous layer on the carrier 11. The term "continuous" as used herein refers to the fact that the structural layout of the bonding layer has a large degree of translation symmetry in a direction along a surface of the bonding layer. In other words, the bonding layer does not suffer from gaps in the layer or unevenness resulting e.g. from separate application processes of different parts of the bonding layer. Because the bonding layer is continuous and does not comprise separately applied areas of different adhesion/release materials for example, the bonding layer can be more flat, which may lead to improved accuracy, e.g. in the application of electronic structures.

Preferably, the bonding layer 12 is provided as a homogeneous layer on the carrier 11. The term "homogeneous" as used herein refers to the fact that the chemical composition of the bonding layer has a large degree of translation symmetry in a direction along a surface of the bonding layer. In other words, a single compound or homogeneous mix is used throughout the bonding layer. Because the bonding layer with different functionalities may be comprised of one composition, it can be applied in a single process step. An example of a process for applying a continuous and homogeneous bonding layer may be spin-coating. Of course also other methods may be used for applying the bonding layer 12, with varying degrees of continuity and homogeneity.

In step (S2) of the method, a first area subsection 12a of the bonding layer 12 is selectively irradiated with a first radiation dose per unit area 14a for selectively at least partially curing the first area subsection 12a. A second area subsection 12b of the bonding layer 12 is irradiated with a second radiation dose per unit area 14b that is less than the first radiation dose per unit area 14a. In this way the first area subsection 12a is more cured than the second the area subsection 12b. The degree of curing may influence a bonding potential of the adhesive in a subsequent curing step. Preferably, the second area subsection 12b is not irradiated at all to maintain a full bonding potential of the adhesive at the second area subsection 12b.

In an embodiment, the first and/or second radiation dose 14a, 14b comprises electromagnetic radiation in an ultraviolet wavelength range, i.e. having a wavelength below 450 nanometer, e.g. between 10 and 450 nm. For example, in one embodiment a g-line (435 nm) or more commonly i-line (365 nm) of a Hg light source is used as wavelength for the radiation dose. Preferably the adhesive is sensitive to the specific wavelength used and the wavelength can pass through the applied substrate, e.g. glass or foil. Electromagnetic radiation has an advantage that it can easily be imaged in a desired shape, such that the first area subsection 12a and second area subsection 12b can be well defined.

In step (S3) of the method, a substrate 13 is provided and brought in contact with the bonding layer 12. In particular the substrate 13 contacts both the first area subsection 12a and the second area subsection 12b. The contact surface, especially of the second area subsection 12b with the substrate 13 may determine a bonding strength of the substrate 13 on the carrier 11. Preferably, the substrate 13 covers the bonding layer 12. The substrate can be rigid or flexible, e.g. a foil comprising PEN, PET, PEEK, PI, or PEI.

In step (S4) of the method, the second area subsection 12b is cured while in contact with the substrate 13. Said curing may result e.g. from a third radiation dose 14c, as will be further explained with reference to FIG. 2. The cured second area subsection 12b thus forms an adhesion area 15b between the second area subsection 12b and the substrate 13.

By said curing an adhesion force between the bonding layer 12 and the substrate 13 may be increased at least by a factor of two, preferably much more, e.g. a factor of hundred. The adhesion force may be measured e.g. using a peel test as described with reference to FIG. 6B. The first area subsection 12a forms a release area 15a, wherein an adhesion force between the bonding layer 12 and the substrate 13 is lower than in the adhesion area 15b. This lower adhesion force may be a result of the first area subsection 12a being more cured than the second the area subsection 12b prior to being in contact with the substrate 13.

For example, when the first area subsection 12a is more cured, the radiation curable adhesive 12m may have hardened more. This may lead to a reduced wetting on a subsequently contacting surface of the substrate 13 and a lower adhesion force. Also other adhesion mechanisms may play a role. The role of pre-curing the adhesive may be compared to a typical glue which becomes ineffective after it hardens.

In an embodiment, as shown, the method further comprises the step (S5) of manufacturing electronics 17 on the substrate 13 while the substrate is bonded to the carrier 11 by means of the bonding layer 12. This step need not necessarily be performed at the same location as the previous steps. For example, a releasable substrate on a carrier as produced with steps (S1)-(S4) may be stored and/or transported to a dedicated manufacturing location. In an embodiment, the combined carrier and substrate have the dimensions of a standard semi-conductor wafer. The carrier and substrate can thus be handled by the (semiconductor) wafer processing machines as a wafer, which is typically dimensioned as a disc of 700 micrometer thickness and a diameter of 200 or 300 mm. Standard device wafer dimensions can be found e.g. in the "SEMI M1—Specifications for Polished Single Crystal Silicon Wafers". Of course the dimensions may be different, e.g. for manufacturing some displays, a substrate may typically comprise glass with a thickness between 400 nm and 1200 nm and a surface area between 300 mm by 400 mm and 3.5 m by 3.5 m.

In an embodiment, the method further comprises the step (S6) of cutting the substrate 13 along a perimeter 16 defining the releasable substrate 13a. Preferably, the perimeter 16 is inside the release area 15a, free of the adhesion area 15b. In this way the substrate 13 can be easily peeled from the bonding layer 12 with minimal resistance from the adhesion layer. Optionally, the perimeter 16 can be on the border between the release area 15a and the adhesion area 15b. The perimeter 16 can also be in the adhesion area 15b, though this may result in increased difficulties in releasing the substrate 13. After the substrate is cut, the releasable substrate 13a may be released from the release area 15a, e.g. by peeling the releasable substrate 13a from the bonding layer starting from a position along the perimeter 16. Also other ways for releasing the releasable substrate 13a from the carrier 11 may be envisaged, e.g. uniformly pulling the releasable substrate 13a using a suction device.

Preferably, the bonding layer 12 is kept intact during the cutting of the substrate 13. This way the bonding layer 12 may be more prone to stay behind on the carrier 11 when the releasable substrate 13a is released. Preferably, the carrier 11 is kept intact during the cutting of the substrate 13. This way the carrier 11 may be reused for carrying another substrate. While the present figure shows a single releasable substrate 13a on a carrier 11, alternatively, a plurality of releasable substrates may be provided on the carrier 11, each cut along a respective perimeter. The plurality of releasable substrates may be defined on a common release area 15a or there may be a plurality of release areas. The plurality of release areas may form a pattern on the bonding layer, wherein a plurality of adhesion areas is defined between the release areas. Preferably, the release areas are surrounded by adhesion areas. Of course, the single releasable substrate 13a may also be further divided after it is removed from the carrier 11.

In an embodiment (not shown), the method further comprises heating the substrate 13 to a temperature above a highest temperature encountered by the substrate 13 during the manufacturing (S5) for improving a dimensional stability of the substrate 13 during the manufacturing (S5). Said heating preferably takes place after the curing (S4) the second area subsection 12b and before the manufacturing (S5) electronics 17 on the substrate 13. The inventors observed that after said pre-heating, variations in heat between different manufacturing processes may have less influence on a dimensional stability of the substrate during manufacturing. This was especially observed if the preheating was applied after the substrate was adhered to the carrier. The preheating temperature may be e.g. 10° C. higher or more than a highest expected processing temperature.

In one embodiment, the releasable substrate on a carrier may encounter one or more of the following manufacturing and/or processing steps e.g. during step (S5):

A. Transporting: the adhesion force of the bonding layer is preferably high enough and long lasting to prevent de-lamination of the substrate while the carrier is transported in a cassette or by the transport system in a lithography tool.

B. Spin-coating with resist: spin coating is a technique to apply a thin layer, for example photo resist, on the surface of the substrate. The carrier may rotate at a typical speed of 3000 RPM; this means that the radial force of the bonding layer is preferably high enough to prevent de-lamination or sliding of the substrate over the carrier.

C. Prebaking: the layer of photo resist is baked at about 90° C. for a certain time to harden. This means that the used technique preferably lasts under hot conditions.

D. Exposure: with UV light and a mask it is possible to make patterns in the photo resist layer. The photo resist layer may be activated on places where the light passes the mask. In order to have a good focus of the light beam the surface flatness is preferably less than 1 μm. Furthermore the thickness of the combined substrate on carrier is preferably less than 1.2 mm. Typically, it may be not preferred to connect any wires or vacuum hoses to the carrier because lithography tools use an internal wafer transport and alignment system.

E. Post exposure baking: this step is similar to the pre bake step, only now the temperature is about 120° C. and the baking time is longer. This means again that the bonding preferably lasts under hot conditions.

F. Developing: to get rid of the unwanted photo resist the combined substrate on carrier is cleaned in a bath of cleaning fluid for a certain time. This means that the clamping technique is preferably resistant against (polar) fluids.

G. Plasma treatment: to be sure all the unwanted resist is removed the substrate on carrier undergoes a plasma treatment. This means that small organic particles can be removed by an ionized gas. To be sure the substrate stays on the carrier the clamping technique preferably lasts in a plasma and vacuum environment.

H. Metal layer deposition process: When the photo resist layer is exposed and developed, the negative of the patterns can be made by applying a metal layer over the complete surface of the substrate. The metal deposition process is a sputter technique wherein ionized metal molecules are applied on the surface of the substrate. To be sure the substrate stays on the carrier the clamping technique is preferably able to withstand a plasma and vacuum environment. It may also be common to deposit the metal layer before deposition and exposure of the photo resist and afterwards etch the metal through holes in the photo resist.

I. Wet etching process: The unwanted metal layer on top of the photo resist patterns can be removed by removing the remaining photo resist patterns. This is done by wet etching in a bath of acetone. This means that the clamping technique is preferably resistance against etching chemical fluids.

J. Deposition of Oxide layer: This is the layer determines the mobility in the semi-conductor layer. The higher the mobility, the faster a transistor may become. In order to get the high mobility the oxide layer is preferably annealed at high temperatures (>250° C.) for 2 to 6 hours.

K. Alignment of several layer with respect to the first layer. A thin film electronic structure may consist of several patterned layers (metals, semiconductors, isolators, etc.) which may all be aligned within the limits of the design, typically the displacement is preferably less than 5 μm, e.g. for display applications.

Figure 2:
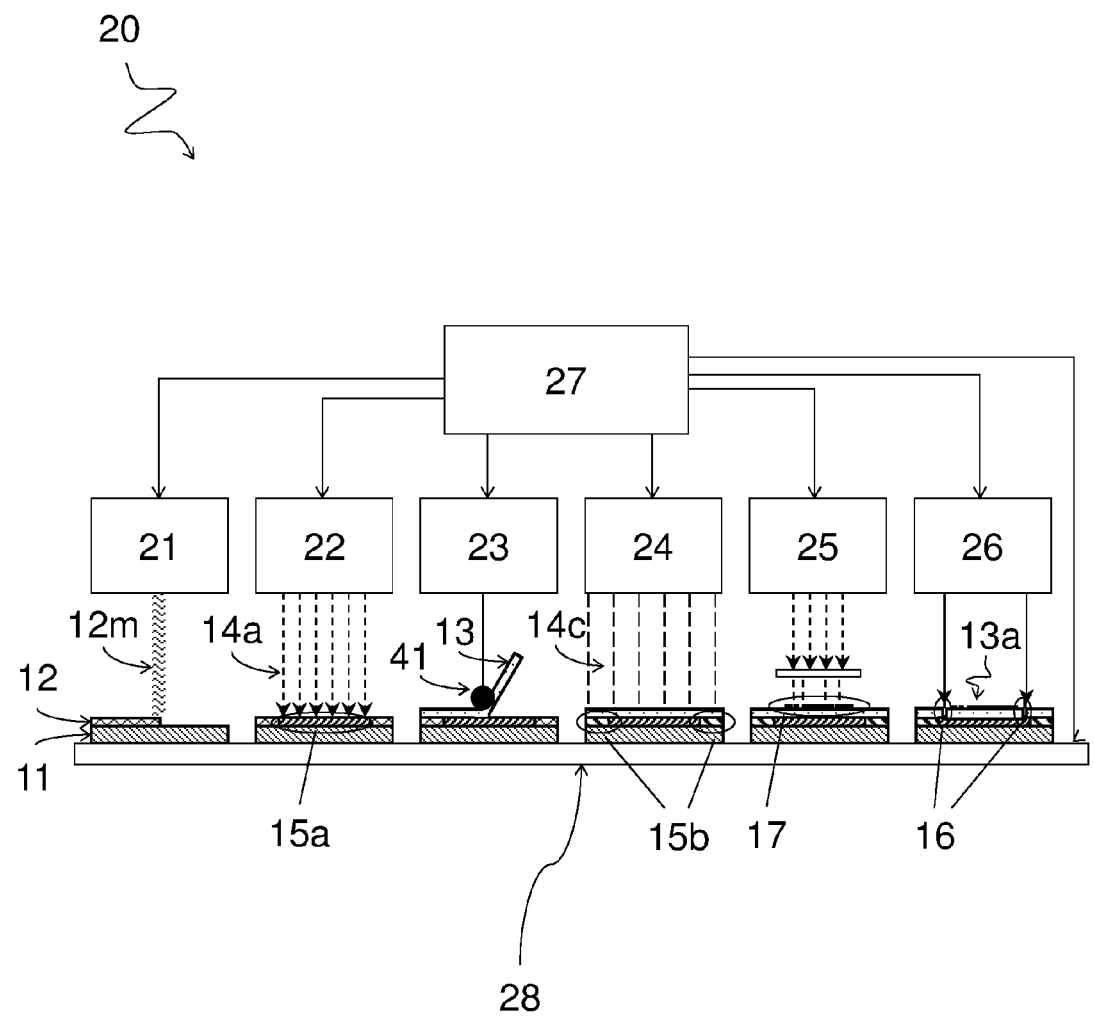
FIG. 2 shows a system for providing a releasable substrate on a carrier.

FIG. 2 shows a system 20 for providing a releasable substrate 13a on a carrier 11. The system 20 comprises a supply system 28, a radiation system 22, a substrate application system 23, a curing system 24, and a controller 27.

The controller 27 of system 20 is arranged for controlling the supply system 28 for providing the carrier 11 with a bonding layer 12 of radiation curable adhesive 12m. The supply system 28 may e.g. be a transport system or other means for providing the carrier 11 with bonding layer 12.

In an embodiment, as shown, the system 20 additionally comprises a layer application system 21, for applying the bonding layer 12 onto the carrier 11. This may be performed using any known layer application technique, though preferably resulting in a uniform and homogeneous bonding layer. The layer application system 21 may e.g. comprise an inkjet printing apparatus for printing the bonding layer 12 or a spray apparatus for spray-on application of the bonding layer 12. In one embodiment, the process for applying the bonding layer 12 to the carrier 11 comprises spin-coating the bonding layer 12. This has an advantage that a more uniformly flat layer may be formed. Alternative to the system 20 comprising a layer application system 21, the carrier 11 with bonding layer 12 may also be fabricated separately.

The controller 27 of system 20 is further arranged for controlling the radiation system 22. The radiation system 22 is controlled for selectively irradiating a first area subsection of the bonding layer 12 with a first radiation dose per unit area 14a. This may selectively at least partially cure the first area subsection. A second area subsection of the bonding layer 12 is not irradiated or irradiated with a second radiation dose per unit area that is less than the first radiation dose per unit area 14a. In this way the first area subsection is more cured than the second the area subsection 12b prior to the application of the substrate.

In an embodiment, the radiation system 22 comprises a source of radiation and a mask, wherein the mask is arranged between the source and the bonding layer 12 for selectively irradiating the first area subsection. The source of radiation may e.g. comprise a UV light source. Additionally the radiation system 22 may comprise projection optics for imaging a pattern of the mask onto the bonding layer 12, in particular for irradiating an area that is to become the release area of the substrate 13 to be placed on the bonding layer 12.

The controller 27 of system 20 is further arranged for controlling the substrate application system 23 for providing a substrate 13 and bringing the substrate 13 in contact with the bonding layer 12. The substrate 13 may thus be contacted with the first and second area subsections of the bonding layer 12. In an embodiment, the substrate application system 23 comprises a lamination system 41 for laminating the substrate 13 onto the bonding layer 12. The substrate 13 may comprise a foil provided from a supply roll (not shown). Also other means for applying the substrate 13 onto the bonding layer 12 may be used, e.g. a robotic arm. While in a preferred embodiment as shown, the substrate 13 comprises a flexible foil and the carrier 11 comprises a rigid support structure, alternatively, the substrate 13 may also be rigid and/or the carrier flexible.

The controller 27 of system 20 is further arranged for controlling the curing system 24 for curing the second area subsection 12b in contact with the substrate 13. The cured second area subsection 12b may thus form an adhesion area 15b between the second area subsection 12b and the substrate 13. The first area subsection 12a forms a release area 15a having a lower adhesion force between the bonding layer 12 and the substrate 13 than the adhesion area 15b as a result of the first area subsection 12a being more cured than the second the area subsection 12b prior to being in contact with the substrate 13.

In an embodiment, the curing system 24 may comprise a radiation system similar to radiation system 22 or may even be the same system. The curing system 24 may be arranged for irradiating the second area subsection with a third radiation dose per unit area 14c, sufficient for at least partially further curing said second area subsection to form the adhesion area 15b. The third radiation dose per unit area 14c may be similar to the first radiation dose per unit area 14a.

It will be appreciated that it is not necessary to selectively irradiate only the adhesion area 15b. Instead, the whole bonding layer 12 may be irradiated. Since the release area is already pre-cured by the radiation system 22, this release area may be less prone to adhesively bond to the substrate 13 under the influence of the radiation 14c than the adhesion area 15b. Preferably, if the adhesion area 15b is cured by means of radiation 14c, the substrate 13 is transparent for said radiation 14c. Alternatively or in addition to radiation, the curing system 24 may also employ other mechanisms for curing the bonding layer 12 at the adhesion area 15b that do not require transparency of the substrate.

In one embodiment, the curing system 24 may additionally or alternatively to a radiation system, comprise a heating system for heating the bonding layer 12 for curing the bonding layer. Preferably, said heating system heats the bonding layer 12 at least initially (before curing) above a glass transition temperature of the adhesion area but below a glass transition temperature of the at least partially cured release area. This way, the adhesive may liquefy in the adhesion area 15b and wet the substrate 13, but not liquefy in the release area 15a. The glass transition temperature of the adhesion area 15b may increase as a result of the curing.

In an embodiment, the system 20 further comprises a cutting system 26. The cutting system 26 may comprise e.g. a knife, a laser cutting tool or any other means for cleaving the substrate 13. The controller 27 of system 20 is further arranged for controlling the cutting system 26 for cutting the substrate 13 along a perimeter 16 defining the releasable substrate 13a. Preferably, the perimeter 16 lies inside the release area 15a free of the adhesion area 15b. This may reduce a force needed for a subsequent release of the releasable substrate 13a from the carrier 11. The perimeter 16 may be defined by controller 27 controlling the cutting process. The controller 27 may e.g. comprise a memory with instructions for cutting the substrate 13 in a certain shape and/or with a certain distance interval with relation to the release area 15a.

In an embodiment, as shown, the system 20 further comprises an electronics manufacturing system 25. The controller 27 of system 20 is further arranged for controlling the electronics manufacturing system 25 for manufacturing electronics 17 on the substrate 13 while the substrate is bonded to the carrier 11 by means of the bonding layer 12. The electronics manufacturing system 25 may comprise sub component systems such as a photo resist layer application system. It will be appreciated that this may be a similar or the same layer application system as used for application of the radiation curable adhesive 12m. The electronics manufacturing system 25 may further comprise an exposure tool, as used e.g. in a lithography apparatus. It will be appreciated that the exposure tool may be similar or the same as the radiation system 22 and/or the curing system 24. The exposure tool, the radiation system 22 and/or the curing system 24 may also share common components, e.g. a common radiation source. The electronics manufacturing system 25 may further comprise a developing system for developing the exposed photo resist layer. It will be appreciated that the developing system may share components e.g. a baking oven with the curing system 24.

In general it will be clear that while the system 20 is shown as comprising a number of discrete system blocks 21-26, these may all be fully or partially integrated or divided into a different system blocks. While a single controller 27 is shown to control the system blocks 21-26, the controller may also be partly or fully integrated in the separate system blocks themselves. The integrated controllers may all or partly be coordinated by a central controller or some controllers may act autonomously. Some system components may not require specific instructions, e.g. the curing system 24 may comprise an oven that is continuously kept at a specific temperature without further instructions.

The controller 27 may comprise one or more processors configured to perform operational acts in accordance with the present systems and methods, such as to provide control signals to the system components 21-26 and/or transporter 28. The processor may be a dedicated processor for performing in accordance with the present system or may be a general-purpose processor wherein only one of many functions operates for performing in accordance with the present system. The processor may operate utilizing a program portion, multiple program segments, or may be a hardware device utilizing a dedicated or multi-purpose integrated circuit. Any type of processor may be used such as dedicated or shared one. The processor may include micro-processors, central processing units (CPUs), digital signal processors (DSPs), ASICs, or any other processor(s) or controller(s) such as digital optical devices, or analog electrical circuits that perform the same functions, and employ electronic techniques and architecture.

The controller 27 may further comprise a memory that may be part of or operationally coupled to the processor. The memory may be any suitable type of memory where data is stored. Any medium known or developed that can store and/or transmit information suitable for use with the present systems and methods may be used as a memory. The memory may also store user preferences and/or application data accessible by the processor for configuring it to perform operational acts in accordance with the present systems and methods.

Furthermore, while each system component 21-26 is shown to work in parallel on a separate carrier 11, the system components 21-26 may also work sequentially on a single carrier. While the figure shows a discrete number of carriers 11, the carrier may also be comprised of a continuous structure, e.g. a continuous foil, wherein different parts of the carrier are simultaneously or sequentially processed with different system components. Similarly, the substrate 13 applied to the carrier may also comprise a continuous foil, and the combination may e.g. be used in roll-to-roll processing. The substrate foil 11 may be adhered to the carrier foil for improving a dimensional and/or thermal stability of the substrate foil 11 during manufacturing.

Figure 3A:
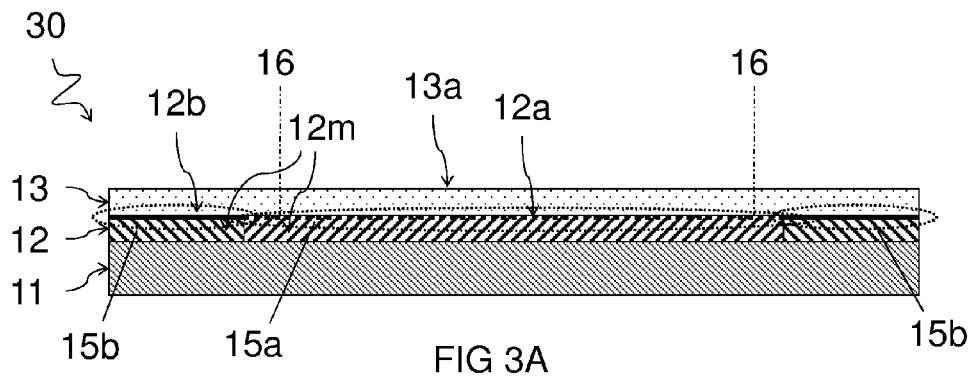
FIGS. 3A-3C shows embodiment of a releasable substrate on a carrier.
Figure 3B:
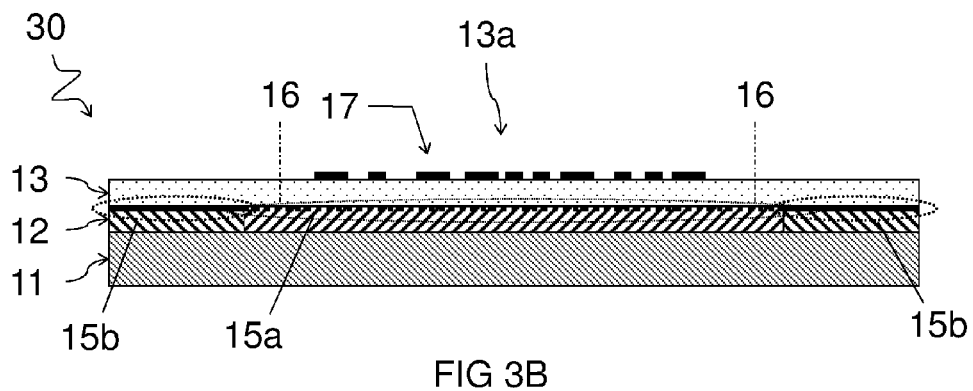
Figure 3C:
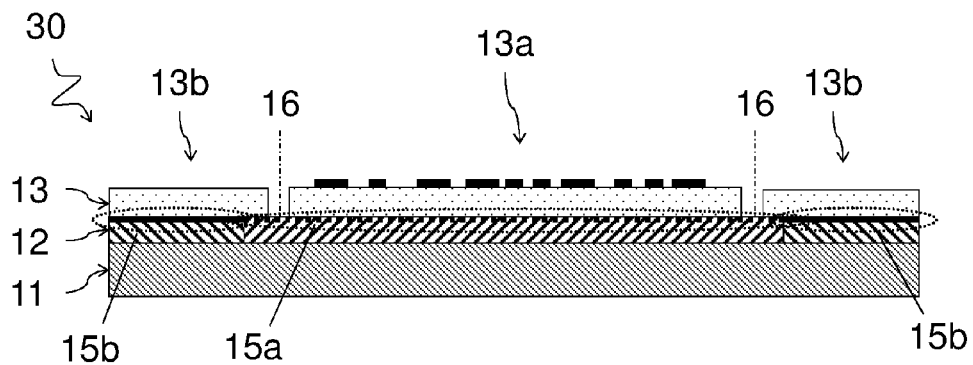

FIGS. 3A-3C show embodiments of a releasable substrate 13a on a carrier 11. As shown the releasable substrate 13a, defined by the perimeter 16, is initially part of a larger substrate 13 adhered to the carrier 11 by means of the bonding layer 12. The bonding layer 12 is formed by a cured adhesive between the substrate 13 and the carrier 11. The cured adhesive is obtainable from curing a radiation curable adhesive 12m. The bonding layer 12 is divided into a first area subsection 12a and a second area subsection 12b. An adhesion area 15b is formed between the second area subsection 12b and the substrate 13. The first area subsection 12a forms a release area 15a having a lower adhesion force between the bonding layer 12 and the substrate 13 than the adhesion area 15b. As discussed with reference to FIGS. 1 and 2, this may be a result of the first area subsection 12a being more cured than the second the area subsection 12b prior to being in contact with the substrate 13.

The localized pre-curing of the bonding layer prior to the application of the substrate may result in the surface of the bonding layer 12 exhibiting a higher degree of wetting to the substrate 13 at the adhesion area 15b than at the release area 15a when the substrate 13 is applied (FIG. 1, step S4). After final curing (FIG. 1, step S4) the bonding layer 12 may be more intertwined with the substrate 13 at the adhesion area 15b than at the release area 15a.

In an embodiment, the substrate 13 is transparent to radiation usable for curing radiation curable adhesive 12m. This has an advantage that the adhesion area 15b may be cured by said radiation when the substrate covers the adhesion area 15b.

FIG. 3A shows an embodiment of a releasable substrate 13a on a carrier 11 that may result after steps (S1)-(S4) of the method described with reference to FIG. 1 are completed. In particular, the resulting bonding layer forms an release area 15a and an adhesion area 15b between the carrier 11 and substrate 13 having different adhesive characteristics.

FIG. 3B shows an embodiment of a releasable substrate 13a on a carrier 11 that may result after additionally also step (S5) is completed, i.e. after electronics 17 are manufactured on the substrate 13. As shown the electronics 17 are located preferably within the release area 15a, such that the foil including the electronics 17 may be locally released from the carrier 11.

FIG. 3C shows an embodiment of a releasable substrate 13a on a carrier 11 that may result after additionally also step (S6) is completed, i.e. after the releasable substrate 13a is cut along the perimeter 16.

Figure 4A:
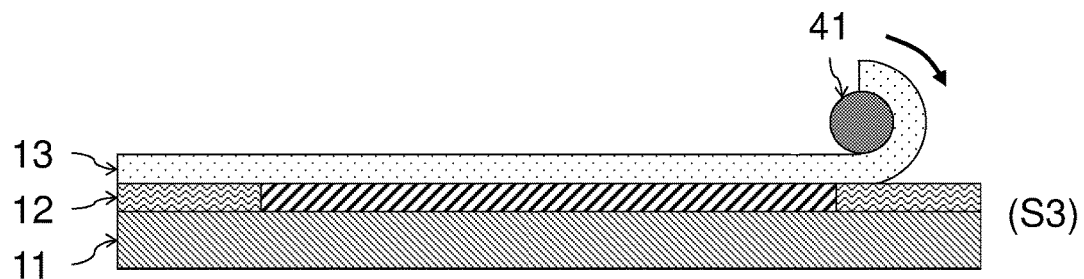
FIG. 4A shows an embodiment of a step of bringing a substrate in contact with a bonding layer.

FIG. 4A shows an embodiment of a step (S3) of bringing a substrate 13 in contact with a bonding layer 12. In particular, the embodiment shown comprises rolling a flexible substrate 13 using a lamination tool 41. The lamination tool 41 may e.g. comprise a roller. In an embodiment, the lamination tool 41 comprises means for applying a pressure on the substrate 13 while it is applied. This may improve an adhesion of the substrate 13 on the bonding layer 12. In another or further embodiment, the lamination tool 41 comprises heating means for locally heating the bonding layer 12 while applying the substrate 13. This may also improve an adhesion of the substrate 13 on the bonding layer 12. In one example, the lamination tool 41 comprises a hot roll laminator having a temperature >90° C., e.g. above a glass transition temperature of the adhesive in the adhesive area, and applying a pressure of between 2 and 3 bar to the substrate while applying.

Figure 4B:
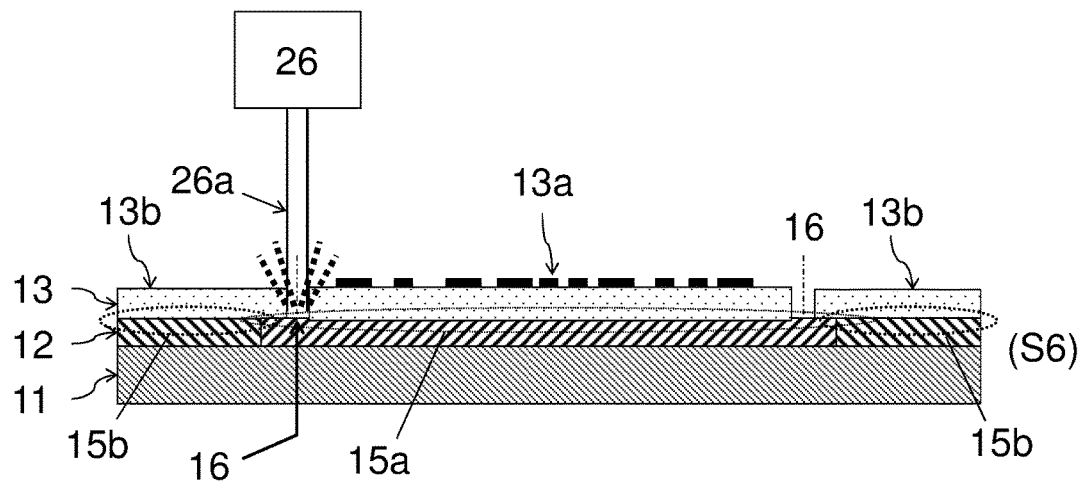
FIG. 4B shows an embodiment of a step of cutting a substrate.

FIG. 4B shows an embodiment of a step of cutting a substrate using a cutting system 26 comprising a laser cutter. As shown, the laser cutter projects a laser beam 26a that cuts the substrate 13 along the perimeter 16. Preferably, the laser cutter is tuned for only cutting the substrate 13 and leaving the bonding layer 12 substantially intact. This way the bonding layer 12 may remain behind on the carrier 11 when the releasable substrate 13a is released.

Figure 4C:
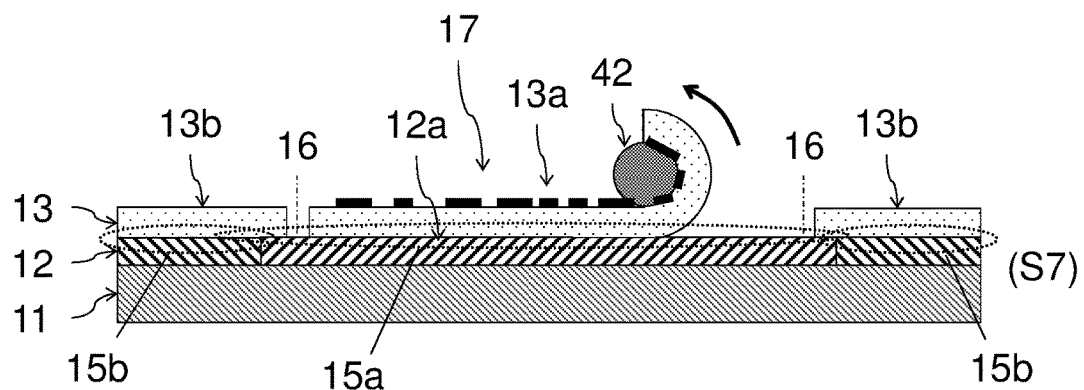
FIG. 4C shows an embodiment of a step of releasing a releasable substrate from a release area.

FIG. 4C shows an embodiment of a step (S7) of releasing a releasable substrate 13a from a release area 15a. In particular, the releasable substrate 13a is released from the release area 15a by peeling the releasable substrate 13a starting from a position along the perimeter 16. In the shown embodiment, the release is performed by a release tool 42. The release tool 42 may comprise means for attaching itself to the releasable substrate 13a. For example, the release tool 42 may comprise vacuum channels (not shown) for creating a local under-pressure that causes the releasable substrate 13a to stick to the release tool 42.

In the shown embodiment, the release tool 42 comprises a roller arranged with a minimum radius such that the releasable substrate 13a with electronics 17 is not damaged by excessive bending of the releasable substrate 13a during release. In one example, it was found that a flexible substrate with an electronics layer 17 having a layer thickness of 100 µm could be removed without damage by using a release radius of 12 cm or more.

Figure 5:
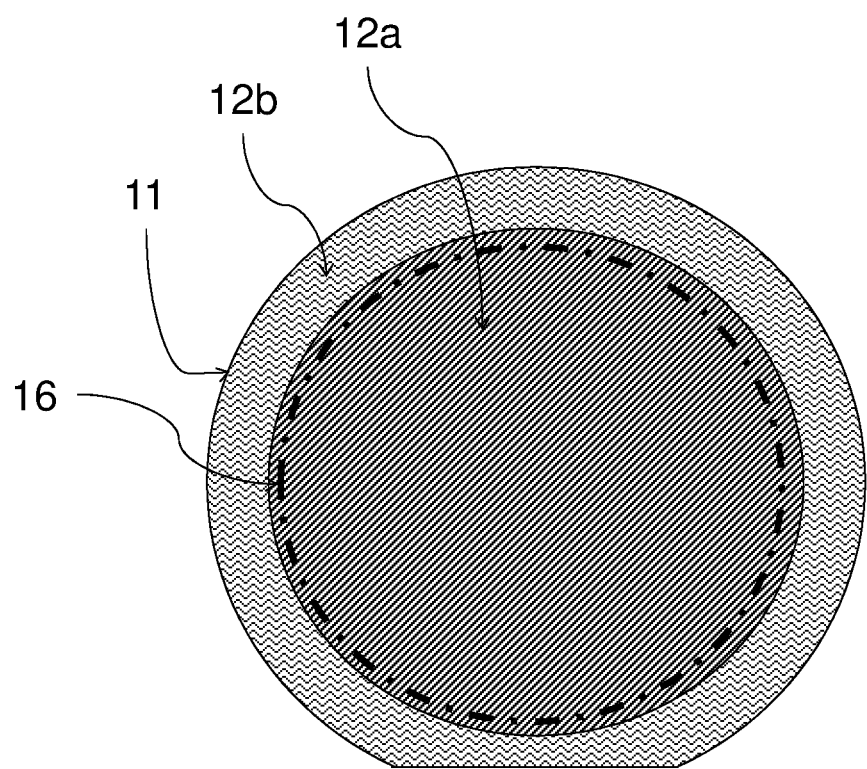
FIG. 5 shows an embodiment of a bonding layer divided into a first and second area subsection.

FIG. 5 shows a top view of an embodiment of a bonding layer on top of a carrier (not visible), wherein the bonding layer is divided into a first area subsection 12a and second area subsection 12b. As shown, the first area subsection 12a is surrounded along perimeter 16 by the second area subsection 12b. This may have an advantage, that the release area formed by the first area subsection 12a is shielded from all sides by the adhesion area formed by the second area subsection 12b. This shielding may prevent delaminating of the substrate 13 also at the release area 15a that is at the center of the bonding layer, e.g. under vacuum conditions.

The carrier 11 as shown has the dimensions of a typical wafer, as a round slab. In the present embodiment one side of the round shape is flattened, e.g. for rough alignment purposes. This shape carrier has an advantage that it can be used without modification in existing semiconductor manufacturing apparatuses. Of course also other shaped carriers may be used. Alternative to a discrete carrier as shown, the carrier may also comprise a continuous structure, e.g. a continuous carrier foil. In an embodiment of a continuous carrier foil, the release area is located in a central lane of the foil surrounded at the sides of the foil by adhesive areas. This embodiment has a similar advantage that the release area is shielded from all sides of the bonding layer by an adhesive area.

Figure 6A:
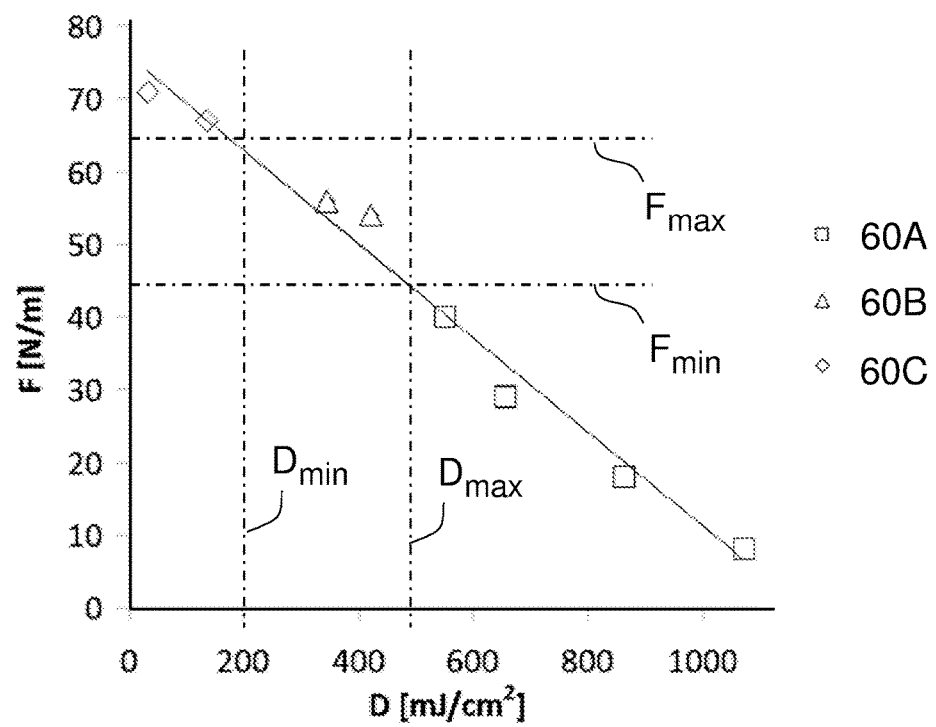
FIG. 6A shows a comparative graph of peel force as a function of radiation dose.
Figure 6B:
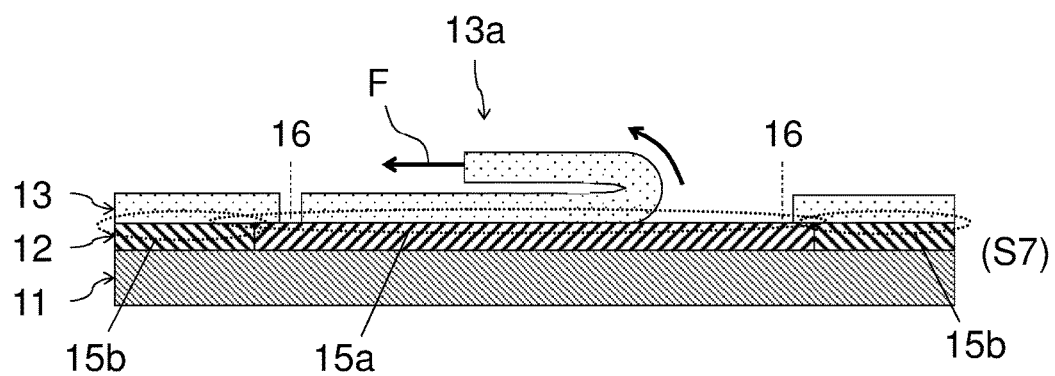
FIG. 6B shows an embodiment of a peel test.

FIG. 6A shows a comparative graph of a series of peel tests, performed e.g. as illustrated in the embodiment of FIG. 6B.

FIG. 6B shows an embodiment of a 180° peel test wherein a releasable substrate 13a is peeled from a release area 15a by a force F. The release area 15a is part of the bonding layer 12 that connects the substrate 13 to the carrier 11. The bonding layer further comprises an adhesion area 15b. The releasable substrate 13a is formed when the substrate 13 is cut along the perimeter 16 that is within the release area 15a. In a peel test a force F is measured that is required to peel a substrate 13a at a certain constant speed at a certain angel with respect to the interface of the bonding layer 12, in this case 180 degrees plane angle.

With reference to FIG. 6A, the peel test was performed for different samples wherein a radiation dose D was varied, which radiation dose was administered to the bonding layer 12 prior to the application of the substrate 13, i.e. during step (S2) as discussed in FIG. 1. The radiation dose D is normalized to the surface area of the bonding layer receiving the radiation dose and measured in milli-Joule per square centimeter (mJ/cm$^2$). After the radiation dose D was administered, the substrate was contacted with the bonding layer (see FIG. 1, step S3). After the contacting, the bonding layer was further cured (see FIG. 1, step S4) to form, by said curing, a variable adhesive connection between the bonding layer 12 and the substrate 13.

The peel force F as depicted in FIG. 6A is normalized to the width of the substrate 13a that is peeled and measured in Newton per meter (N/m). An equivalent measure to the peel force F may be a peel energy E required to peel a unit surface area of the substrate from the bonding layer. This energy may also be referred to as the fracture energy, i.e. the energy required to fracture the interface between the bonding layer and the substrate. A fracture energy E may be measured in Joule per square meter (J/m$^2$).

Measuring the peel force F is one way to quantify and/or compare the adhesion force between a substrate 13 and a bonding layer 12. The adhesion force may be considered as the force that opposes the peel force as the substrate is peeled from the bonding layer. The adhesion force may depend on conditions under which the substrate is peeled. One way to compare the adhesion forces of two different areas of the bonding layer or between different samples may be using a peel test under the same or similar conditions. For example, a statement that a release area 15a has a lower adhesion force between the bonding layer 12 and the substrate 13 than the adhesion area 15b, can be interpreted as saying that a peel force required for peeling the substrate 13 from the release area 15a of the bonding layer 12 is lower than a peel force required for peeling the substrate 13 from the adhesion area 15b, wherein the peeling is performed under equal conditions, e.g. the same peel angle 180°, peel speed 0.01 m/s, temperature 293 K, and/or other conditions.

The present peel tests were performed for a bonding layer comprising a layout of the release and adhesion areas as shown in FIG. 5. The adhesion force of the edge part (adhesion area 15b) is relatively high and the adhesion force of the middle part (release area 15a) can be tuned, e.g. the viscosity properties of the adhesive can be tuned to find a compromise for suitable stress conditions.

Further experimental conditions used to produce the graph of FIG. 6A were as follows:
  peel conditions: peel angle 180° (degrees plane angle with respect to bonding layer), peel speed: 0.01 m/s (meter per second);
  temperature: room temperature (293 Kelvin)
  ambient pressure: standard atmosphere (1 bar)
  bonding layer: adhesive SU-8, thickness: 5 μm (spin-coated);
  substrate: 25 μm thick foil, material: polyethylene terephthalate (PEEK);
  carrier: silicon wafer, thickness 700 micrometer, diameter 150 millimeter;
  radiation: ultraviolet light at 365 nm, i-line of Hg light source,
  release area: initial dose D: 0-1000 mJ/cm$^2$ (prior to application of substrate), total dose 1000-2000 mJ/cm$^2$; surface: circular area with diameter 140 millimeter;
  adhesive area: initial dose: 0 mJ/cm$^2$ (prior to application of substrate), total dose 1000-2000 mJ/cm$^2$; surface 4-5 mm wide lane surrounding release area; —curing: post bake 15 minutes at 95° C., relaxation time 10 minutes;
  curing: hard bake 15 minutes at 250° C.

With continued reference to FIG. 6A, the square markers 60A depict test samples that received a relative high radiation dose, more than Dmax during step (S2) of FIG. 1. This has caused the radiation curable adhesive at the release area to be relatively well-cured prior to the application of the substrate. When the adhesive was subsequently further cured in contact with the substrate, the resulting adhesion force of the release area became relatively low, less than Fmin. It was found that while the substrate can be released without damage after processing temperatures above 250° C., the adhesion strength is not sufficient to survive typical vacuum conditions or temperature shocks. Accordingly, it was found that during the manufacturing (step S5 in FIG. 1) of electronics on the substrate 13, at least a minimum adhesion force Fmin at the release area 15a is required for the substrate 13 to remain functionally intact during the manufacturing.

The diamond markers 60C depict test samples that received a relative low radiation dose, less than Dmin during step (S2). This has caused the radiation curable adhesive at the release area to be relatively uncured prior to the application of the substrate. When the adhesive was subsequently further cured in contact with the substrate, the resulting adhesion force of the release area became relatively high, more than Fmax. It was found that while the substrate survives vacuum and temperature shocks, it cannot be reproducible removed without damage of the substrate (the * in the graph indicates that the substrate was tearing before the end of the peel measurement). Accordingly, it was found that at most a maximum adhesion force Fmax at the release area 15a is allowed to achieve that the substrate 13a remains functionally intact during the releasing of the releasable substrate 13a from the release area 15a (step S7 e.g. as shown in FIG. 4C).

The triangular markers 60B depict test samples that received a radiation dose D between Dmin and Dmax (200-450 mJ/cm$^2$). Accordingly, since the peeling force F is a bijective (one-to-one) monotone function of the radiation dose D, the peeling force required to remove the substrate is between Fmin and Fmax as previously determined. It was found that the substrate remains intact both during processing conditions and during release of the substrate from the release area. It will be appreciated that the force Fmin required of the release area during processing conditions may depend in part on the strength and layout of the adhesion area that shields the release area. In particular, without the adhesion area the minimum force Fmin required during processing may exceed the maximum force Fmax allowed for releasing the substrate and there would not be any suitable range to meet both conditions. The presently disclosed embodiment thus provides an advantage of an easily tunable adhesion force in a release area plus a strong adhesion force in an adhesion area that can at least partially shield the release area.

In an embodiment, as discussed, the minimum and maximum forces Fmin and Fmax are determined that correspond to the conditions between which the substrate survives both the processing conditions and the release conditions. These may be determined in conjunction with the strength and layout of a particular adhesion area. Accordingly, with reference to FIG. 1, the first irradiation dose per unit area 14a is tuned for partially curing the first area subsection 12a for tuning an adhesion force F of the release area 15a between said minimum adhesion force Fmin and said maximum adhesion force Fmax. The adhesion force F results from the further curing of the first area subsection (12a) in contact with the substrate (13). This adhesion force will be stronger if the first area subsection 12a was less cured during the first radiation dose 14a and less strong if the first area subsection 12a was more cured during the first radiation dose 14. It will be appreciated that by tuning an adhesion force of the release area, larger substrates may be handled compared e.g. to a release area having only minimal adhesion force.

In an embodiment of a releasable substrate on a carrier, e.g. as shown in FIG. 6B, the adhesion force F between the substrate and the release area 15a of the bonding layer 12 is between 45 and 65 N/m as measured in a 180° peel test at a peel speed of 0.01 m/s at ambient conditions (room temperature 293K, pressure 1 bar). In a further embodiment, the adhesion force F between the substrate and the adhesion area 15b of the bonding layer 12 is higher than 70 N/m as measured by the same peel test. In a further embodiment, the release area has a surface area of more than 100 $cm^2$, e.g. for manufacturing a flexible display with 7 inch diagonal a release area of about 135 $cm^2$ may be used. In a further embodiment, the adhesive area forms a strip surrounding the release area with a minimal strip width of 2 mm, preferably more than 3 mm. In one embodiment, the adhesion force of the adhesion area is more than twice that of the release area as measured under equal peel conditions, e.g. in a 180° peel test at a peel speed of 0.01 m/s at ambient conditions.

Figure 7:
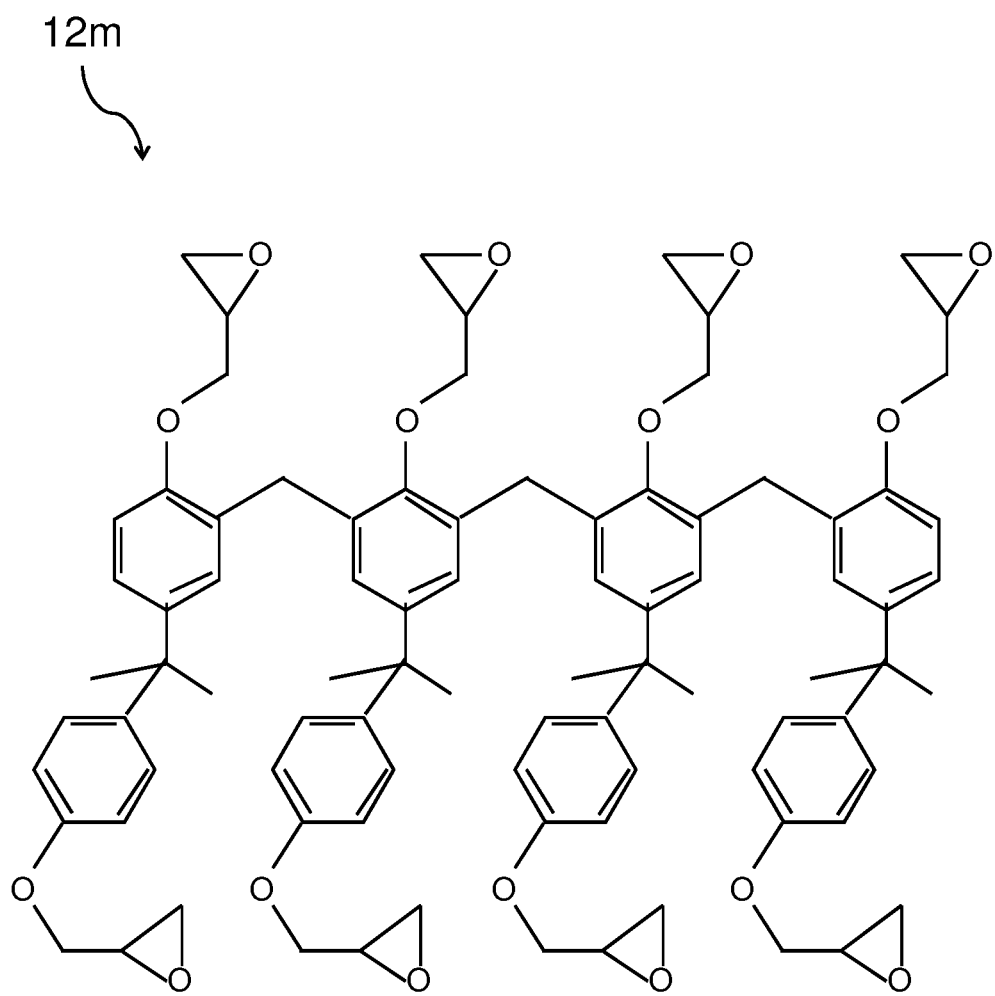
FIG. 7 shows an epoxy resin comprised in an embodiment of a radiation curable adhesive.

FIG. 7 shows an epoxy resin comprised in an embodiment of a radiation curable adhesive. One suitable radiation curable adhesive is commonly known as "SU-8". SU-8 is a 3 component UV-sensitive negative photo-resist based on epoxy resin, gamma butyrolactone and triaryl sulfonium salt. The lithographic structuring is based on a photoinitiator triaylium-sulfonium that releases lewis acid during UV radiation. This acid works as catalyst for the polymerization.

Accordingly, in an embodiment, the radiation curable adhesive 12m comprises a photo-initiator, e.g. a photo acid, that catalyzes, e.g. by cationically induced polymerization, curing of the radiation curable adhesive. In a further embodiment, the radiation curable adhesive 12m comprises epoxides. While one example of an epoxide is shown also other epoxides may be suitable. In general, also other radiation curable adhesives may be used, e.g. in an embodiment, a radiation curable adhesive comprises molecules with rings containing heteroatoms which react by cationic ring-opening polymerization. Besides cationic ring-opening polymerization, also other mechanisms for radiation induced polymerization may be used and also adhesives that cure by other mechanisms than polymerization.

Figure 8A:
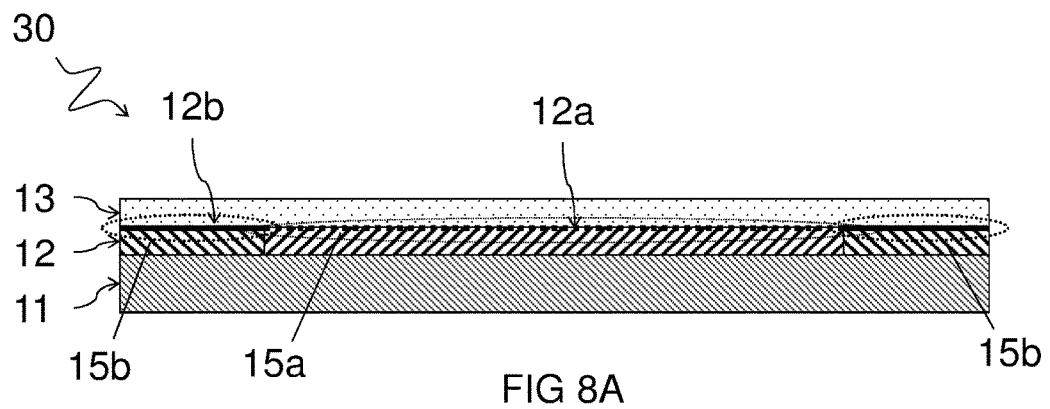
FIG. 8A shows an embodiment of a releasable substrate on a carrier obtained with the presently disclosed method.

FIG. 8A shows an embodiment 30 of a releasable substrate 13 on a carrier 11 obtained with the presently disclosed methods. As shown, due to the disclosed manufacturing method, the adhesive area 15b and the release area 15a may be formed of an initially uniform bonding layer 12. This has an advantage that the bonding layer may be very flat.

Figure 8B:
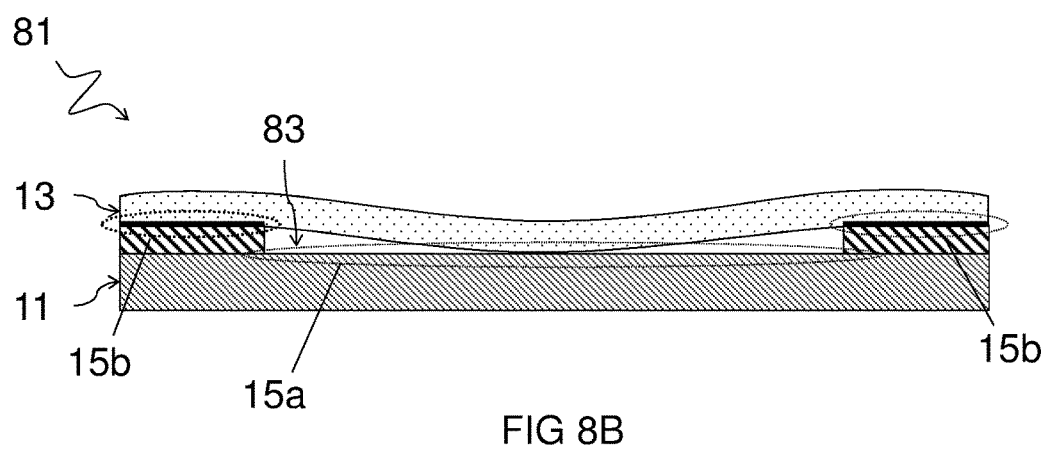
FIG. 8B shows a releasable substrate on a carrier obtained with a different method.

FIG. 8B shows an example 81 of a releasable substrate 13 on a carrier 11 obtained with a different method. In particular, this method uses an adhesive strip forming the adhesive area 15b. The release area 15a is formed by the absence of the adhesive strip. This example 81 has a disadvantage compared to the embodiment 30 of FIG. 8A that the substrate 13 has a large unevenness due to the gap 83 formed by the height of the adhesive strip 15b on the carrier 11

Figure 8C:
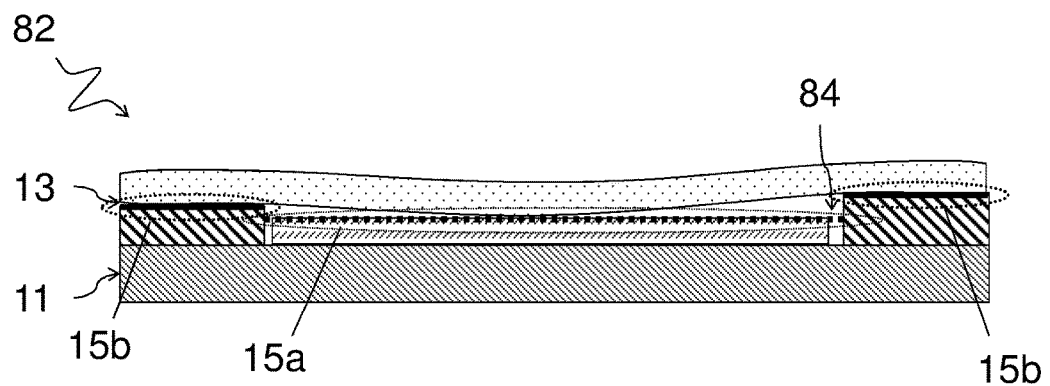
FIG. 8C shows another releasable substrate on a carrier obtained with yet a different method.

FIG. 8C shows another example 82 releasable substrate 13 on a carrier 11 obtained with yet a different method. In particular, similar to example 81 of FIG. 8B, an adhesive strip is used for forming the adhesive area 15b. Different from example 81, a further release strip is applied between the adhesive strips to partly compensate the height difference. Nevertheless, because unlike the embodiment 30 of FIG. 8A, the release areas 15b and the adhesive area 15a are not formed of an initially uniform bonding layer 12, some height differences may remain and also there may be a gap 84 between the separate areas.

Figure 9A:
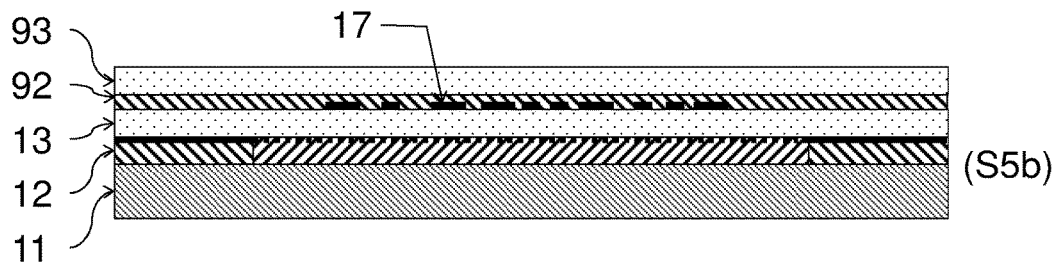
FIGS. 9A and 9B show embodiments of steps of a method wherein a further substrate is adhered to a releasable substrate on a carrier
Figure 9B:
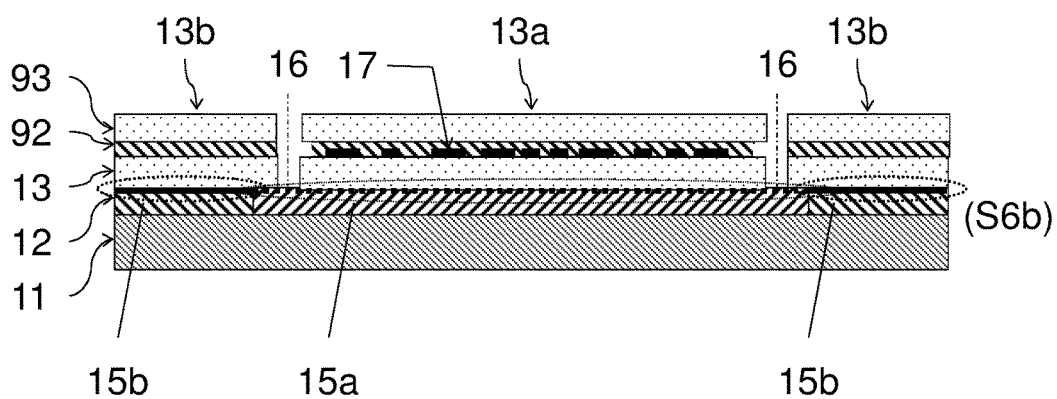

FIGS. 9A and 9B show embodiments of further steps that may be comprised in a method as described e.g. with reference to FIG. 1.

FIG. 9A show a step (S5b) wherein the substrate 13 is a first substrate and the method further comprises laminating a second substrate 93 onto the first substrate 13. Step (S5b) of FIG. 9A may follow step (S5) of FIG. 1. In step (S5b) a second adhesive layer 92 is applied on top of the substrate 13 and the electronics 17. The second substrate 93 is adhered to the second adhesive layer 92.

FIG. 9B show a step (S6b) of cutting the second substrate 93 along the perimeter 16 wherein the releasable substrate 13a comprises parts from the first and second substrates 13,93. Step (S6b) of FIG. 9B may substitute step (S6) of FIG. 1. It will be appreciated that the release area 15a of the lower substrate 13 can be used for releasing the whole stack. In other words, the adhesive layer 92 need not comprise a release area.

Manufacturing of flexible electronics, e.g. TFT, directly on flexible polymer substrates is complicated due to a low dimensional and thermal stability of the polymer substrate. Previously known solutions for improving the dimensional stability of foils by adhering to a rigid substrate may have had drawbacks e.g. an allowed processing temperature may be low (<200° C.) or the solution may be costly, time consuming, and may require additional processing steps and equipment.

In one example of a previous solution, a bond de-bond manufacturing protocol is used wherein a substrate (e.g. polymer foil) is bonded with a temporary adhesive to a rigid carrier. After TFT processing the foil can be de-bonded by, thermal, solvent, light, and/or or mechanical triggering. However, bond de-bond solutions may be limited to 200° C. due to chemistry of used glue systems. Most temporary adhesives are polymeric bonding materials like wax and soluble glues. These systems in general may have a temperature limit below 200° C. Above this temperature the temporary adhesive force may become permanently bonded to the foil and carrier and therefore the foil may not be easily delaminated for the carrier. In this way high temperature resistant polymer foils may not be used to their full benefit.

Another example of a previous solution may be referred to as EPLaR (Electronics on Plastic by Laser Release). A solution processable polymer (e.g. polyimide, PI) is deposited onto a rigid carrier. After TFT processing the polymer foil can be de-bonded by laser release (Interfacial Melting).

However, the process may be expensive and require additional steps. Yield may also be an issue. Suitability of this process for large area may be questionable. This process may withstand a high temperature (~300° C.), but can only be used when the polymer film can be solution processed. Accordingly, free standing films such as extrusion foils like PEN, PEEK, PI, PEI etc. may not be useable. Furthermore, for curing the deposited polymer film, a high temperature >300° C., and a long time >60 min, may be needed. Also the delaminating may require high power lasers, optical transparent carriers and long de-bonding time, making this process less convenient.

Typically applied temporary adhesives have a temperature resistance below 200° C. Above this temperature the temporary adhesive force may become permanently bonded to the foil and carrier and therefore the foil can not be easily delaminated. Some adhesives have been developed that can laminate and delaminate foils without breaking the patterns on the foil. The development route is to provide an adhesive layer that bonds strongly during processing but should easily release the foil after the processes are finished, without any adhesive traces being left on the foil. This however results in a contradiction of an adhesive being able to bond strong to the foil and carrier but also to bond weak during delamination. One solution here is to find an optimum in bonding strength.

It will be appreciated that using the present disclosure it may no longer be required to find an optimum in bonding strength since the bonding layer is separated in an adhesive area and a release area. By choosing a permanent adhesive and selectively bonding the foil to the carrier, it may be possible to delaminate the non-bonded part of the foil after a high temperature treatment, >200° C., without applying much mechanical stress during delamination. In this way higher processing temperatures can be reached compared to temporary adhesive solutions.

Accordingly, the presently disclosed methods and systems provide a temporary bonding of a flexible polymer foil to a rigid substrate that may withstand high temperatures (e.g. 250° C.) and TFT manufacturing processes (like vacuum, UV lithography, spin-coating, dry and wet etching, plasma treatment etc.) by means of segmented adhesion with a radiation curable adhesive that may be resistant to high temperatures, e.g. SU-8. After TFT processing, the foil may be easily delaminated by cutting (e.g. laser, knife, etc.) without applying much mechanical stress to the TFT structures. In addition, this method may also be applicable to large area processing (>6 inch diameter). Another advantage of the presently disclosed method may be that, in principle, there is no limitation regarding the choice of polymer foil type compared to some other solutions where only solution processed films can be used.

Furthermore, it may generally be desired to provide a flat rigid carrier to a substrate to be able to perform lithographic processes on the substrate, e.g. a foil. To be able to provide a flat foil on carrier solution to perform lithographic processes it is not desirable to deposit an adhesive selectively since this may cause height differences between the bonded and the non-bonded area resulting in air trapped between the rigid carrier and the foil (see FIGS. 8B and 8C). By using a radiation curable adhesive it is possible to selectively switch off the bonding force while maintaining the flatness. It may thus be possible to have a homogenous and flat coverage of the adhesive on the carrier. By selectively exposing parts of the adhesive on carrier, e.g. to UV light, the adhesive force can be controlled. In this way the foil can be laminated on top of the adhesive and it will mostly stick to the non exposed part of the adhesive. In this way, after lamination, the polymer surface can be very flat, e.g. having a root mean squared surface roughness less than 1 µm. Since UV light is already used widely in thin film electronics manufacturing there is no need for an additional tool.

The various elements of the embodiments as discussed and shown offer certain advantages, such providing a releasable substrate on a carrier. Of course, it will be appreciated that any one of the above embodiments or processes may be combined with one or more other embodiments or processes to provide even further improvements in finding and matching designs and advantages. It is appreciated that this invention offers particular advantages to manufacturing of electronics on a flexible foil substrate, and in general can be applied for any application wherein a substrate is to be securely yet releasably adhered to a carrier.

Finally, the above-discussion is intended to be merely illustrative of the present system and should not be construed as limiting the appended claims to any particular embodiment or group of embodiments. Thus, while the present system has been described in particular detail with reference to specific exemplary embodiments thereof, it should also be appreciated that numerous modifications and alternative embodiments may be devised by those having ordinary skill in the art without departing from the scope of the present systems and methods as set forth in the claims that follow. The specification and drawings are accordingly to be regarded in an illustrative manner and are not intended to limit the scope of the appended claims.

In interpreting the appended claims, it should be understood that the word "comprising" does not exclude the presence of other elements or acts than those listed in a given claim; the word "a" or "an" preceding an element does not exclude the presence of a plurality of such elements; any reference signs in the claims do not limit their scope; several "means" may be represented by the same or different item or implemented structure or function; any of the disclosed devices or portions thereof may be combined together or separated into further portions unless specifically stated otherwise. The mere fact that certain measures are recited in mutually different claims does not indicate that a combination of these measures cannot be used to advantage.

What is claimed is:

1. A method for providing a releasable substrate on a carrier, the method comprising:
   providing the carrier-with a bonding layer of radiation curable adhesive (12m);
   selectively irradiating a first area subsection of the bonding layer with a first radiation dose per unit area for selectively at least partially curing the first area subsection, wherein a second area subsection of the bonding layer is not irradiated or irradiated with a second radiation dose per unit area that is less than the first radiation dose per unit area such that the first area subsection is more cured than the second the area subsection;
   providing a substrate and bringing the substrate in contact with the first area subsection and the second area subsection;
   curing the second area subsection in contact with the substrate for forming an adhesion area between the second area subsection and the substrate; wherein the first area subsection forms a release area, an adhesion force between the bonding layer and the substrate being lower in the release area than in the adhesion area as a result of the first area subsection being more cured than the second area subsection prior to being in contact with the substrate.

2. The method according to claim 1, further comprising manufacturing electronics on the substrate while the substrate is bonded to the carrier by means of the bonding layer.

3. The method according to claim 2, wherein said manufacturing is performed under standard atmospherical pressure (1 bar).

4. The method according to claim 3, further comprising cutting the substrate along a perimeter inside the release area free of the adhesion area, the perimeter-defining the releasable substrate.

5. The method according to claim 4, further comprising releasing the releasable substrate from the release area by peeling the releasable substrate starting from a position along the perimeter.

6. The method according to claim 1, wherein the first area subsection is surrounded along its perimeter by the second area subsection.

7. The method according to claim 5, wherein:
during the manufacturing of electronics on the substrate, at least a minimum adhesion force at the release area is required for the substrate to remain functionally intact during the manufacturing;
during the releasing the releasable substrate from the release area, at most a maximum adhesion force at the release area is allowed for the substrate to remain functionally intact during the releasing; and
the first irradiation dose per unit area is tuned for partially curing the first area subsection before contacting the substrate for tuning an adhesion force of the release area between said minimum adhesion force and said maximum adhesion force, the adhesion force resulting from the further curing of the first area subsection in contact with the substrate.

8. The method according to claim 1, wherein the bonding layer is provided as a continuous and homogeneous layer on the carrier.

9. The method according to claim 1, wherein the substrate comprises a flexible foil and the carrier comprises a rigid support structure.

10. The method according to claim 1, wherein the first and/or second radiation dose comprises electromagnetic radiation in an ultraviolet wavelength range.

11. The method according to claim 1, wherein the radiation curable adhesive comprises a photo-initiator that catalyzes curing of the radiation curable adhesive.

12. The method according to claim 1, wherein the radiation curable adhesive comprises molecules with rings containing heteroatoms which react by cationic ring-opening polymerization.

13. The method according to claim 1, wherein the substrate is a first substrate and the method further comprises laminating a second substrate onto the first substrate; and cutting the second substrate along the perimeter wherein the releasable substrate comprises parts from the first and second substrates.

14. A system for providing a releasable substrate on a carrier, the system comprising a supply system, a radiation system, a substrate application system, a curing system, and a controller arranged for:
controlling the supply system for providing the carrier with a bonding layer of radiation curable adhesive
controlling the radiation system for selectively irradiating a first area subsection of the bonding layer with a first radiation dose per unit area for selectively at least partially curing the first area subsection, wherein a second area subsection of the bonding layer is not irradiated or irradiated with a second radiation dose per unit area that is less than the first radiation dose per unit area such that the first area subsection is more cured than the second the area subsection;
controlling the substrate application system for providing a substrate and bringing the substrate in contact with the first area subsection and the second area subsection;
controlling the curing system for curing the second area subsection in contact with the substrate for forming an adhesion area between the second area subsection and the substrate; wherein the first area subsection forms a release area, an adhesion force between the bonding layer and the substrate being lower in the release area than in the adhesion area as a result of the first area subsection being more cured than the second area subsection prior to being in contact with the substrate.

15. A releasable substrate on a carrier comprising:
a substrate;
a carrier; and
a bonding layer between the substrate and the carrier, wherein the bonding layer is formed by a cured adhesive obtainable from curing a radiation curable adhesive;
wherein the bonding layer is divided into a first area subsection and a second area subsection; wherein a release area is formed between the first area subsection and the substrate and an adhesion area is formed between the second area subsection and the substrate; wherein an adhesion force between the substrate and the bonding layer is lower at the release area than at the adhesion area;
wherein said lower adhesion force at the release area is obtainable by the radiation curable adhesive being more cured at the first area subsection than at the second area subsection prior to the substrate contacting the bonding layer; and
wherein the adhesion force at the adhesion area is formed by radiation induced adhesion of the bonding layer with the substrate obtainable by the radiation curable adhesive being cured at the second area subsection while the substrate contacts the bonding layer.

16. The releasable substrate on a carrier according to claim 15, wherein the adhesion area is formed by radiation induced cross-linking of the radiation curable adhesive to the carrier and substrate.

* * * * *